United States Patent [19]

Stevens

[11] Patent Number: 5,047,862

[45] Date of Patent: Sep. 10, 1991

[54] SOLID-STATE IMAGER

[75] Inventor: Eric G. Stevens, Rochester, N.Y.

[73] Assignee: Eastman Kodak Company, Rochester, N.Y.

[21] Appl. No.: 420,857

[22] Filed: Oct. 12, 1989

[51] Int. Cl.⁵ .................. H04N 3/14; H04N 5/335; H01L 29/78

[52] U.S. Cl. .................. 358/213.29; 358/213.13; 358/213.19; 357/24 LR; 377/57

[58] Field of Search .................. 358/213.19, 213.29, 358/212, 213.13, 213.27, 213.15; 377/61, 62, 57, 58; 357/24 LR

[56] References Cited

U.S. PATENT DOCUMENTS

| | | | |
|---|---|---|---|
| 4,460,912 | 7/1984 | Takeshita et al. | 357/24 |
| 4,471,228 | 9/1984 | Nishizawa et al. | 250/578 |
| 4,589,027 | 5/1986 | Nakamura et al. | 358/213.11 |
| 4,613,402 | 9/1986 | Losee et al. | 156/643 |
| 4,663,771 | 5/1987 | Takeshita et al. | 377/58 |
| 4,679,212 | 7/1987 | Hynecek | 377/58 |
| 4,696,021 | 9/1987 | Kawahara et al. | 377/58 |
| 4,716,466 | 12/1987 | Miida et al. | 358/213.26 |
| 4,733,406 | 3/1988 | Kinoshita et al. | 377/61 |
| 4,760,435 | 7/1988 | Burt | 357/24 |
| 4,809,073 | 2/1989 | Chiba et al. | 358/213.13 |
| 4,856,033 | 8/1989 | Hirota | 377/58 |
| 4,875,101 | 10/1989 | Endo et al. | 358/213.19 |

Primary Examiner—James J. Groody
Assistant Examiner—Safet Metjahic
Attorney, Agent, or Firm—Donald D. Schaper

[57] ABSTRACT

A solid-state imager comprising a substrate of a semiconductor material of one conductivity type having a major surface. A plurality of photodetectors are in the substrate and are arranged in an array of rows and columns. A separate CCD shift register is in the substrate along each column of the photodetectors and between adjacent columns of the photodetectors. Each shift register includes gates which can be operated to selectively transfer charge carriers from the photoconductors in the column at one side thereof into the shift register. A separate drain is adjacent each photodetector and the shift register adjacent the other side of the column of photodetectors. An anti-blooming barrier is provided between each drain and its adjacent photodetector. An exposure control barrier is provided between each drain and the shift register at the opposite side of the column of photodetectors. The shift register is adapted to be operated to selectively reset the photodetectors at the one side thereof by transferring the charge carriers from the photodetectors into and across the shift register to the drain adjacent the other side thereof.

12 Claims, 3 Drawing Sheets

SOLID-STATE IMAGER

FIELD OF THE INVENTION

The present invention relates to a solid-state imager, and, more particularly to a solid-state imager which comprises a plurality of photodetectors and charge coupled device (CCD) transfer registers to carry the charge from the photodetectors and which includes an electronic shutter and anti-blooming features.

BACKGROUND OF THE INVENTION

Solid-state imagers, in general, comprise a plurality of photodetectors arranged in an array, such as an array of rows and columns, and shift registers, such as CCD shift registers, between the columns of the photodetectors. The photodetectors in each column are coupled, such as by a transfer gate, to their adjacent shift register so that the charge carriers generated and accumulated in the photodetectors can be selectively transferred to the shift register. The shift registers transfer the charge carriers to the read-out circuit of the imager.

One problem which has arisen in this type of solid-state imager is referred to as "blooming." If, during the accumulation period of the imager, the period when the photodetectors are receiving photons from the image and converting the photons to charge carriers, a photodetector accumulates an excess amount of the charge carriers, some of the charge carriers will overflow from the photodetector into the adjacent shift register and/or photodetector. This adversely affects the charge carriers in the shift register being transferred to the read-out circuit causing "blooming". A conventional technique used for preventing blooming, i.e. an anti-blooming technique, uses an overflow drain adjacent the photodetector with the drain being isolated from the photodetector by a potential barrier. The potential barrier between the photodetector and anti-blooming drain is lower than the barrier provided by the transfer gate between the photodetector and the CCD shift register during the accumulation period. Thus, if the charge level in the photodetector reaches a sufficient amount to raise the photodetector potential to a level above that of the barrier between the photodetector and the anti-blooming drain, additional signal carriers will be swept over into the anti-blooming drain where they are removed by the drain supply. This prevents excess charge from flowing into the shift register during the integration period and thereby prevents blooming.

Another problem which has arisen in certain types of solid-state imagers relates to controlling the exposure time of the photodetectors. For certain applications, such as still photography, it is desirable to be able to control the time that the photodetectors generate charge carriers as a result of being exposed to the image being taken. Various shuttering techniques have been developed for this purpose. However, the structure which has been required to achieve the shuttering for exposure control as well as the gating and drain required for anti-blooming control has taken up space on the imager and therefore has reduced the fill factor of the imager. Therefore, it would be desirable to have a solid-state imager which includes both a shutter for exposure control and anti-blooming features in which the number of elements required for these features is minimized to improve the fill factor of the imager and to reduce the number of electrodes required to perform these functions and thereby reduces system complexity.

SUMMARY OF THE INVENTION

The present invention relates to a solid-state imager which includes a plurality of photodetectors arranged in an array of rows and columns, and a separate shift register, such as a CCD shift register, extending along each column of the photodetectors. Gating means is provided between each photodetector and the shift register at one side thereof to permit the selective transfer of charge carriers from the photodetector to the shift register at the one side. A drain is provided adjacent each photodetector and adjacent the shift register at the other side thereof. Anti-blooming barrier means is provided between each of the photodetectors and its respective drain. A barrier is provided between each of the drains and the shift register on the other side of the photodetector which allows selective transfer of charge carriers from each photodetector across the shift register at the one side thereof to the drain on the other side of the shift register to permit the photodetector to be reset for exposure control purposes.

More particularly, the imager of the present invention comprises a substrate of a semiconductor material of one conductivity type having a major surface. A plurality of photodetectors are in the substrate at the major surface and a shift register is in the substrate between pair of the photodetectors. Means is provided for selectively transferring charge carriers from each photodetector to an adjacent shift register. A drain is provided adjacent each of the photodetectors and adjacent one of the shift registers. Means forming a potential barrier is provided between each drain and its adjacent photodetector and between each drain and its adjacent shift register. Means is provided for allowing the selective transfer of charge carriers from the photodetector adjacent each shift register across the shift register to the drain adjacent the shift register.

The invention will be better understood from the following more detailed description taken with the accompanying drawings and claims.

Figure 1:
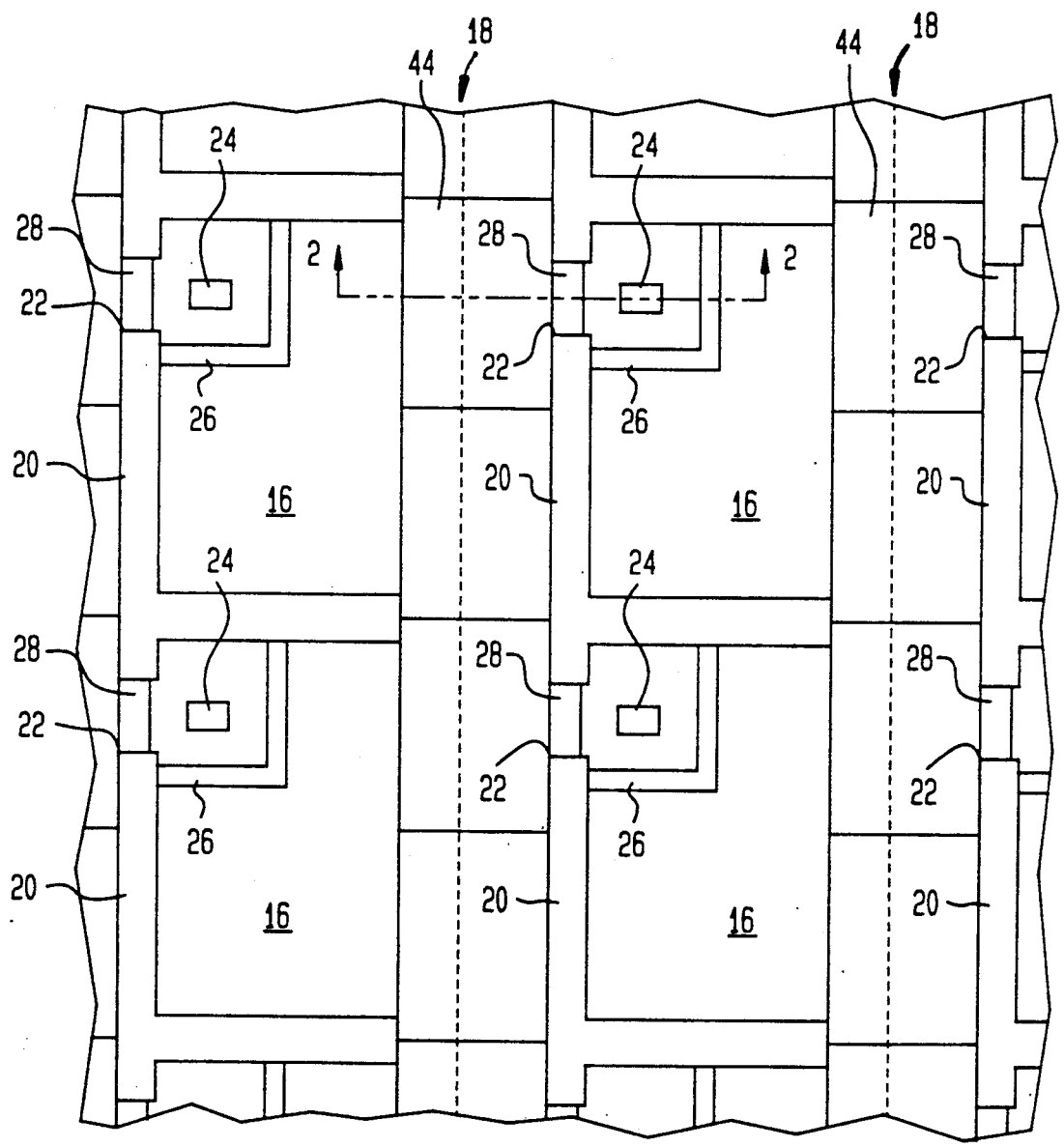
FIG. 1 is a top view of a portion of a solid-state imager in accordance with the present invention.

It should be understood that the various FIGS. of the drawing are not necessarily drawn to scale.

DETAILED DESCRIPTION

Figure 2:
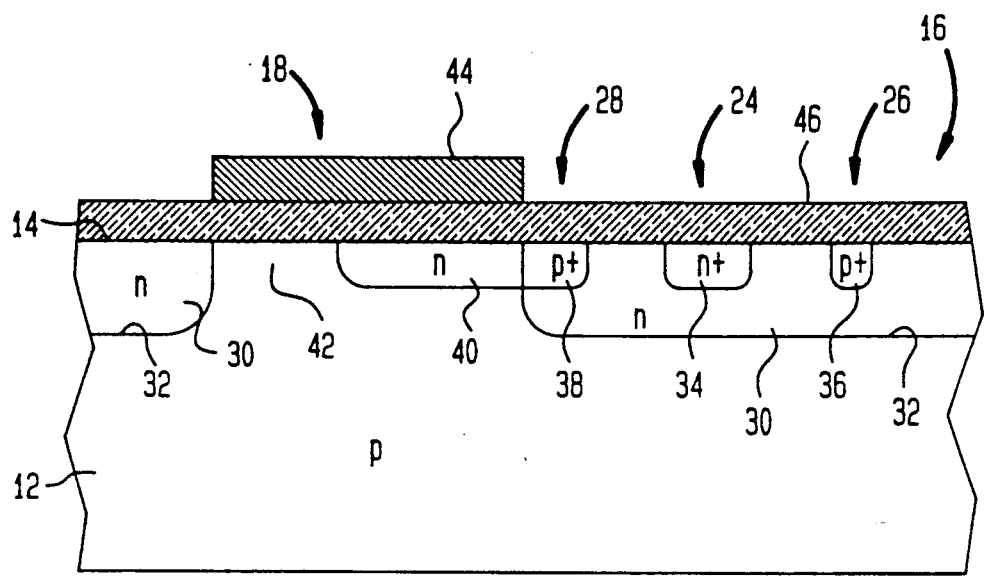
FIG. 2 is a sectional view taken along line 2—2 of FIG. 1.

Referring to FIGS. 1 and 2, there is shown a solid-state imager 10 in accordance with the present invention. FIG. 2 is a sectional view taken along line 2—2 of FIG. 1. Imager 10 comprises a substrate 12 of a semiconductor material, such as single crystalline silicon, of one conductivity type (shown as p-type) having a major surface 14. In the substrate 12 along the major surface 14 are a plurality of photodetectors 16. The photodetectors 16 are arranged in an array of rows and columns.

Along each column of the photodetectors 16 is a shift register 18, shown as a CCD shift register, which extends along the entire column of photodetectors 16 and between adjacent columns of the photodetectors 16. As will be explained, the photodetectors 16 in each column are adapted to transfer the charge carriers generated therein into the CCD shift register 18 at one side thereof, the shift register 18 to the right of each column of photodetectors 16 as shown in the drawings.

A channel stop 20 extends along the sides of each photodetector 16 between adjacent photodetectors 16 and along the side of each photodetector 16 which is adjacent the shift register 18 to which the photodetector 16 is not connected, the shift register to the left of each photodetector as shown in the drawings. However, the channel stop 20 has an opening 22 therein along the side of each photodetector 16 which is adjacent the shift register 18 to which the photodetector 16 is not connected.

A drain 24 is contiguous each photodetector 16 and contiguous the opening 22 in the channel stop 20; this is shown in FIGS. 1 and 2, where each of the drains 24 is located in a region 30 of the photodetector 16 and is in close proximity to a shift register 18. An anti-blooming barrier 26 extends between each drain 24 and its respective photodetector 16. An exposure control gate 28 extends across each opening 22 in the channel stop 20 between each drain 24 and the adjacent shift register 18. Although not shown, there is a separate drain 24 and an accompanying exposure control gate 28 at the right hand side of the last shift register 18 at the right hand side of the array in alignment with each row of drains 24.

As shown in FIG. 2, each photodetector 16 is a photodiode comprising a region 30 of a conductivity type opposite that of the substrate 12 (shown as n-type) and being in the substrate 12 and extending to the major surface 14. Typically, the n-type region 30 is of a conductivity of about $10^{17}$ impurities/cm$^3$. The region 30 forms a pn junction 32 with the substrate 12. The drain 24 comprises a highly conductivity region 34 of the conductivity type opposite that of the substrate (shown as n+ type) in the substrate 12 at the major surface 14 and within each regions 30. The drain region 34 is typically of a conductivity of about $10^{19}$ impurities/cm$^3$. The anti-blooming barrier 26 is a virtual gate comprising a highly conductive region 36 of the same conductivity type as the substrate 12 (shown as p+ type) in the substrate 12 and extending to the major surface 14. The anti-blooming barrier region 36 is typically of a conductivity of about $10^{18}$ impurities/cm$^3$. The exposure control gate 28 is also a virtual gate. It comprises a highly conductive region 38 in a portion of the substrate 12 which extends to the major surface 14 and is of essentially the same conductivity type and impurity concentration as the anti-blooming barrier region 36. The channel stop 20 (shown in FIG. 1 but not in FIG. 2) comprises a region of the same conductivity type as the substrate 12 (i.e. p-type) and is within a portion of the substrate 12 and extends to the major surface 14. It has an impurity concentration of about $10^{19}$ impurities/cm$^3$.

Each CCD shift register 18 comprises a buried channel region 40 of a conductivity type opposite that of the substrate 12 (shown as n-type) in the substrate 12 and extending to the major surface 14. The channel region 40 is typically of a conductivity type of about $10^{17}$ impurities/cm$^3$. The channel region 40 extends between two columns of the photodetectors 16 for the full length of the columns. The channel region 40 is contiguous with the edge of the adjacent exposure control gate regions 38 within region 30 one side thereof, but is spaced from the edge of the region 30 on the other side thereof. This forms a transfer region 42 across the substrate 12 between each photodetector region 30 and the channel region 40. A plurality of conductive gates 44 are over and spaced along the channel region 40. The gates 44 are insulated from the substrate 12 by a layer 46 of an insulating material, typically silicon dioxide, which is on the major surface 14. The gates 44 may be made of a metal or doped polycrystalline silicon. The gates 44 extend across the complete space between the columns of photodetectors 16 so as to cover both the channel region 40 and the transfer region 42.

Figure 3:
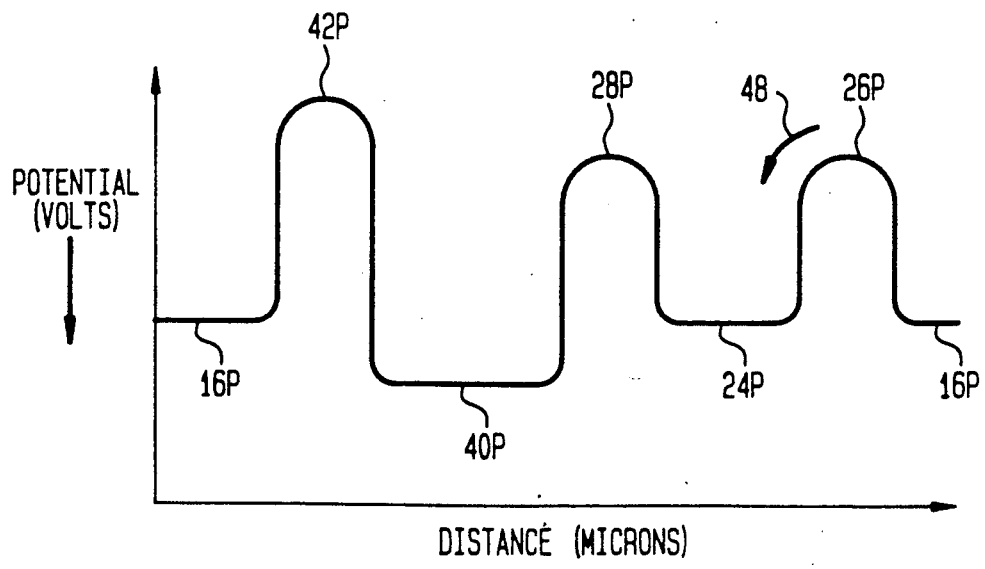
FIG. 3 is a potential diagram of the solid-state imager of the present invention during the integration period.
Figure 4:
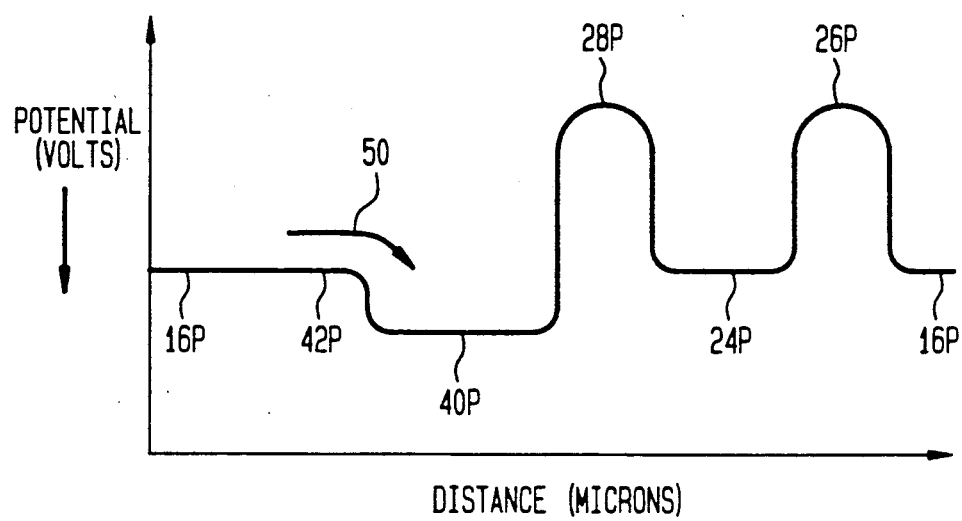
FIG. 4 is a potential diagram of the solid-state imager during the initial portion of the photodiode reset period.
Figure 5:
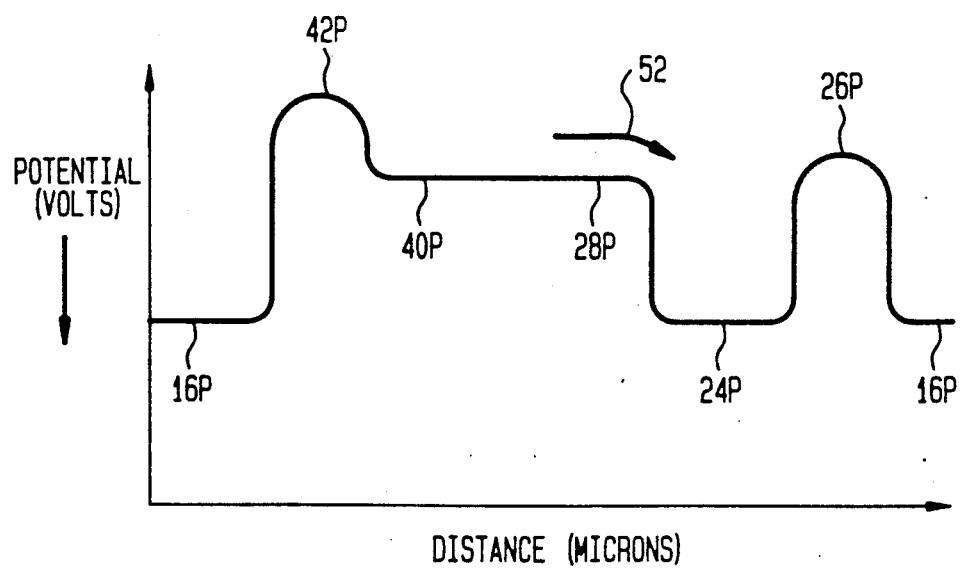
FIG. 5 is a potential diagram of the solid-state imager during the final portion of the photodiode reset period.

Referring now to FIGS. 3, 4 and 5, there are graphically shown the potential (volts) on the y axis and distance (microns) on the x-axis of the structure of FIG. 2 with the lowest voltage being at the intersection of the x and y axes and the lowest voltage being at the top of the y axis. FIG. 3 is for the integration period; FIG. 4 is for the reset period of the photodiode 16; and FIG. 5 is a final portion of the reset period of the photodiode 16.

During the integration period (see FIG. 3) of the imager 10, the period in which the photodetectors 16 are exposed to the image and convert photons from the image to charge carriers, the potential 26P in the anti-blooming barrier region 36 is lower than the potentials 16P and 24P in the photodetectors 16 and drain regions 34 respectively because of the higher doping level in the barrier region 36. However, the potential 26P in the anti-blooming barrier region 36 is higher than the potential 42P in the transfer region 42 between the photodetectors 16 and the shift register channel region 40. Thus, if the amount of the charge carriers collected in a photodetector 16 reduces the photodetector potential to a level below the barrier potential 26P, additional carriers are swept over into the drain region 34 as indicated by the arrow 48, where they are carried away. This provides for anti-blooming protection in the imager 10.

To control the exposure time of the imager 10, at a time t during the integration period prior to the transfer period equal to the desired exposure time, the photodetectors 16 are reset. As shown in FIG. 4, the photodetectors 16 are reset by applying a positive voltage to the shift register gates 44 to raise the potential 42P in the transfer region 42 to the potential 16P in the photodetector 16. At the same time, the potential 40P in the channel region 40 is raised to a level above the potential 16P in the photodetector 16. Thus, the charge carriers in the photodetector 16 will flow into the channel region 42 as indicated by the arrow 50 and thereby empty the photodetector 16.

The voltage applied to the gates 44 is then switched to a negative voltage. As shown in FIG. 5, this reduces the potential 40P in the channel region 40 to a level below the potential 28P in the exposure control gate region 38. At the same time the potential 42P in the transfer region 42 is reduced to be lower than that to which the channel region potential 40P is reduced. Thus, the charge carriers which had been transferred to the channel region 40 now flow across the exposure control gate 28 into the drain region 34 where they are carried away.

After the photodetectors 16 are reset, they will receive photons from the image and convert the photons to charge carriers for the desired exposure time. At the end of the exposure period, a positive voltage is again applied to the shift register gates 44 to raise the potential 42P in the transfer region 42 and allow the charge carriers in the photodetectors 16 to be transferred to the CCD channel region 40. The CCD shift registers 18 are then operated in the normal manner to transfer the charge carriers along the shift registers 18 to the read-out circuitry, not shown. However, the voltage applied to the shift register gates 44 to move the charge carriers along the channel region 40 is lower than that used to transfer the charge carriers from the photodetectors 16 to the shift register 18 and greater than those used to drain the charge from the CCD into the drain.

Thus, there is provided by the present invention a solid-state imager 10 in which the drain 24 serves as both an anti-blooming drain for the photodetectors 16 and as a drain for resetting the photodetectors to achieve a desired exposure control. The CCD shift registers 18 serve not only to carry the charge carriers from the photodetectors 16 to the read-out circuitry, but also as a shutter to transfer charge carriers from the photodetectors 16 to the drain 24 during the resetting of the photodetectors 16. Thus, both exposure control and anti-blooming are achieved using a minimum number of elements and without taking up any substantial amount of additional space on the substrate 12 so that the fill factor of the imager is not substantially lowered. Although the solid-state imager 10 has been shown as having pn junction type photodiodes as photodetectors 16, other types of photodetectors can be used. Also, although the shift registers 18 have been shown as being CCD shift registers, other types of shift registers which permit charge carriers to be transferred thereacross to the drain 24 during resetting of the photodetectors 16 can be used. It is to be understood that the specific embodiments described herein are merely illustrative of the spirit of the invention. Various modifications consistent with the spirit of the invention are possible.

What is claimed is:

1. A solid-state imager comprising:
   a substrate of a semiconductor material of one conductivity type having a major surface;
   a plurality of photodetectors in the substrate at said major surface;
   a separate shift register in said substrate at said major surface and extending between pairs of the photodetectors;
   means for selectively transferring charge carriers from each photodetector to an adjacent shift register;
   a drain in said substrate at said major surface contiguous to each photodetector and one of said shift registers;
   barrier means between each of the drains and its contiguous photodetector;
   barrier means between each of the drains and its contiguous shift register; and
   means for selectively transferring charge carriers from each of the photodetectors into and across its adjacent shift register to the drain contiguous to the shift register.

2. The solid-state imager of claim 1 in which the drain comprises a highly conductive region of the conductivity type opposite that of the substrate within the substrate at the major surface.

3. The solid-state imager of claim 2 in which the barrier means between the drain and the adjacent photodetector and shift register comprises a region of the same conductivity type as the substrate but more highly conductive than the substrate at said major surface.

4. The solid-state imager of claim 3 in which the shift register is a CCD shift register and comprises a channel region in the substrate at said major surface and extending between two photodetectors, and conductive gates over and insulated from said major surface and spaced along said channel region.

5. The solid-state imager of claim 4 in which the channel region of the shift register comprises a region of a conductivity type opposite that of the substrate within the substrate at said major surface, one side of the channel region being spaced from an adjacent photodetector to form a transfer region therebetween and the other side of the channel region being contiguous with the barrier region of an adjacent drain, and the gates extend across both the channel region and the transfer region.

6. The solid-state imager of claim 5 in which each photodetector comprises a region of a conductivity type opposite that of the substrate, and the drain region and barrier regions are in the photodetector region.

7. A solid-state imager comprising:
   a substrate of a semiconductor material of one conductivity type having a major surface;
   a plurality of photodetectors in said substrate at said major surface, said photodetectors being arranged in an array of rows and columns;
   a separate shift register in said substrate at said major surface along each column of photodetectors and between adjacent columns of the photodetectors;
   means for selectively transferring charge carriers from each photodetector to a shift register at one side thereof;
   a separate drain in said substrate at said major surface contiguous to each photodetector and the shift register adjacent the other side of the column of photodetectors;
   barrier means between each drain and its contiguous photodetector and contiguous shift register; and
   means for selectively transferring charge carriers from each photodetector into and across the shift register adjacent the one side of the photodetector to a drain contiguous to the shift register.

8. The solid-state imager of claim 7 in which each drain comprises a highly conductive region of the conductivity type opposite that of the substrate within the substrate at said major surface.

9. The solid-state imager of claim 8 in which the barrier means between each drain and its adjacent photodetector and shift register comprises a region of the same conductivity type as the substrate but more highly conductive in the substrate at said major surface.

10. The solid-state imager of claim 9 in which each shift register is a CCD shift register comprising a channel region in the substrate at said major surface and extending between adjacent columns of the photodetectors, and conductive gates over and insulated from said major surface and spaced along said channel region.

11. The solid-state imager of claim 10 in which the channel region of each shift register comprises a region of the conductivity type opposite that of the substrate with one side edge of the channel region being spaced from one adjacent column of photodetectors to form a transfer region therebetween and the other side edge of the channel region being contiguous with the barrier region between the shift register and the drain in the other adjacent column of photodetectors, and the shift register gates extend across the channel region and the transfer region.

12. The solid-state imager of claim 11 in which each of the photodetectors comprises a region of a conductivity type opposite that of the substrate within the substrate at said major surface, and the drains and barrier regions are within the photodetector regions.

* * * * *